(12) United States Patent
Zhang et al.

(10) Patent No.: US 12,342,687 B2
(45) Date of Patent: Jun. 24, 2025

(54) PREPARATION METHOD OF DISPLAY PANEL, DISPLAY PANEL AND DISPLAYING DEVICE

(71) Applicant: BOE Technology Group Co., Ltd., Beijing (CN)

(72) Inventors: Yongfeng Zhang, Beijing (CN); Xue Dong, Beijing (CN); Zhiqiang Jiao, Beijing (CN); Lei Zhao, Beijing (CN); Jiushi Wang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/584,241

(22) Filed: Feb. 22, 2024

(65) Prior Publication Data
US 2024/0196665 A1 Jun. 13, 2024

Related U.S. Application Data

(63) Continuation of application No. 17/416,417, filed as application No. PCT/CN2020/128101 on Nov. 11, 2020, now Pat. No. 11,943,973.

(30) Foreign Application Priority Data

Nov. 14, 2019 (CN) .......................... 201911115421.8

(51) Int. Cl.
H01L 27/14 (2006.01)
H01L 29/04 (2006.01)
(Continued)

(52) U.S. Cl.
CPC ......... *H10K 59/123* (2023.02); *H10K 50/818* (2023.02); *H10K 59/124* (2023.02);
(Continued)

(58) Field of Classification Search
CPC .... H10K 59/123; H10K 71/00; H10K 59/124; H10K 50/818; H10K 59/35;
(Continued)

(56) References Cited

U.S. PATENT DOCUMENTS 9,093,023 B1* 7/2015 Kim ..................... G09G 3/3233
11,943,973 B2* 3/2024 Zhang ................. H10K 71/621
(Continued)

FOREIGN PATENT DOCUMENTS

CN 102231840 A 11/2011
CN 103472651 A 12/2013
(Continued)

OTHER PUBLICATIONS

First Office Action in the Chinese Patent Application No. 201911115421.8 dated Aug. 26, 2021; English translation attached.
(Continued)

*Primary Examiner* — Niki H Nguyen
(74) *Attorney, Agent, or Firm* — Intellectual Valley Law, P.C.

(57) ABSTRACT

Disclosed are a display panel and a displaying device. The display panel includes a plurality of first-color subpixels, and each first-color subpixel includes a base, the base including a first driving electrode and a second driving electrode; at least one first electrode, disposed at a side of the base and is connected to the first driving electrode; at least one second electrode, disposed at a same side of the base with the first electrode and is connected to the second driving electrode; an intermediate layer, disposed between the first electrode and the second electrode; wherein the first electrode and the second electrode divide the first-color subpixel into a plurality of secondary pixels, the first electrode and the second electrode are insulated with each other via the intermediate layer, and are respectively connected to
(Continued)

the first driving electrode and the second driving electrode, and control the secondary pixels independently.

19 Claims, 10 Drawing Sheets

(51) Int. Cl.
| | | |
|---|---|---|
| *H01L 29/15* | (2006.01) | |
| *H01L 31/036* | (2006.01) | |
| *H10K 50/818* | (2023.01) | |
| *H10K 59/123* | (2023.01) | |
| *H10K 59/124* | (2023.01) | |
| *H10K 59/80* | (2023.01) | |
| *H10K 71/00* | (2023.01) | |
| *H10K 50/813* | (2023.01) | |
| *H10K 59/35* | (2023.01) | |

(52) U.S. Cl.
CPC . *H10K 59/80515* (2023.02); *H10K 59/80518* (2023.02); *H10K 71/00* (2023.02); *H10K 50/813* (2023.02); *H10K 59/35* (2023.02)

(58) Field of Classification Search
CPC .. H10K 50/813; H10K 59/131; H10K 59/122; H10K 59/1213; H10K 59/1201; H10K 59/12; H10K 59/38; H10K 59/121; H10K 50/844; H10K 59/1216; H10K 59/221; H10K 59/80521; H10K 59/873; H10K 65/00; H10K 71/13; H10K 71/621; H10K 71/78; H10K 71/80; H10K 85/10; H10K 85/615; H10K 85/6574; H10K 10/466; H10K 10/84; H10K 2101/20; H10K 2102/321; H10K 2102/331; H10K 30/82; H10K 50/12; H10K 50/157; H10K 50/165; H10K 50/166; H10K 50/854; H10K 59/13; H10K 59/50; H10K 59/878
See application file for complete search history.

(56) References Cited

U.S. PATENT DOCUMENTS

| | | | | |
|---|---|---|---|---|
| 2014/0028181 | A1* | 1/2014 | Lee | H05B 33/14 |
| | | | | 313/504 |
| 2014/0042408 | A1* | 2/2014 | Akagawa | H10K 50/844 |
| | | | | 257/40 |
| 2014/0117316 | A1* | 5/2014 | Choi | H10K 59/131 |
| | | | | 438/26 |
| 2014/0374704 | A1* | 12/2014 | Jang | H10K 59/12 |
| | | | | 438/23 |
| 2015/0077669 | A1 | 3/2015 | Wu et al. | |
| 2015/0115233 | A1* | 4/2015 | Kim | H10K 50/15 |
| | | | | 257/40 |
| 2015/0144905 | A1* | 5/2015 | Kim | H10D 30/6704 |
| | | | | 257/40 |
| 2015/0333110 | A1* | 11/2015 | Park | H01L 21/308 |
| | | | | 438/23 |
| 2015/0340410 | A1 | 11/2015 | Hack et al. | |
| 2016/0133880 | A1* | 5/2016 | Lee | H10K 50/858 |
| | | | | 257/40 |
| 2017/0076651 | A1 | 3/2017 | Xu et al. | |
| 2017/0084213 | A1 | 3/2017 | Yang et al. | |
| 2017/0155891 | A1 | 6/2017 | Hu et al. | |
| 2017/0163976 | A1 | 6/2017 | Jin | |
| 2017/0193898 | A1 | 7/2017 | Lee et al. | |
| 2018/0012946 | A1* | 1/2018 | Bang | H10D 30/6713 |

FOREIGN PATENT DOCUMENTS

| | | |
|---|---|---|
| CN | 105093553 A | 11/2015 |
| CN | 105140265 A | 12/2015 |
| CN | 106773094 A | 5/2017 |
| CN | 107544157 A | 1/2018 |
| CN | 108987450 A | 12/2018 |
| CN | 109164655 A | 1/2019 |
| WO | 2015192646 A1 | 12/2015 |
| WO | 2017004862 A1 | 1/2017 |
| WO | 2020062798 A1 | 4/2020 |

OTHER PUBLICATIONS

Notice of Allowance in the U.S. Appl. No. 17/416,417, dated Nov. 22, 2023.

International Search Report mailed Feb. 18, 2021, regarding PCT/CN/2020/128101.

* cited by examiner

PREPARATION METHOD OF DISPLAY PANEL, DISPLAY PANEL AND DISPLAYING DEVICE

CROSS REFERENCE TO RELEVANT APPLICATIONS

This application is a continuation of U.S. application Ser. No. 17/416,417, filed Jun. 18, 2021, which is a national stage application under 35 U.S.C. § 371 of International Application No. PCT/CN2020/128101, filed Nov. 11, 2020, which claims priority to Chinese Patent Application No. 201911115421.8, filed Nov. 14, 2019. Each of the forgoing applications is herein incorporated by reference in its entirety for all purposes.

TECHNICAL FIELD

The disclosure relates to the technical field of display, in particular to a preparation method of a display panel, a display panel and a displaying device.

BACKGROUND

The glasses-free 3D (short for 3-dimensional) display technology is a stereoscopic image display technology that allows people to see vivid images without wearing 3D glasses. It frees people from traditional 3D glasses, fundamentally solves the problem of dizziness caused by wearing 3D glasses for a long time, and greatly improves the comfort level.

The glasses-free 3D display technology can be divided into the grating type glasses-free 3D technology and the cylindrical lens 3D display technology according to different display principles. A left view and a right view are formed by parallax barriers like gratings or cylindrical lenses. Since the left view and the right view captured by two eyes of the viewer are two images with parallax, the viewer can see a 3D image without wearing 3D glasses after the left view and the right view with parallax are superimposed and regenerated in the viewer's brain.

SUMMARY

In an aspect, there is provided a display panel, comprising a plurality of first-color subpixels, wherein each first-color subpixel comprises:
  a base, the base comprising a first driving electrode and a second driving electrode;
  at least one first electrode, disposed at a side of the base and is connected to the first driving electrode;
  at least one second electrode, disposed at a same side of the base with the first electrode and is connected to the second driving electrode;
  an intermediate layer, disposed between the first electrode and the second electrode;
  wherein the first electrode and the second electrode divide the first-color subpixel into a plurality of secondary pixels, the first electrode and the second electrode are insulated with each other via the intermediate layer, and are respectively connected to the first driving electrode and the second driving electrode, and control the secondary pixels independently;
  wherein a front projection of the first electrode on the base is adjacent to or partially overlaps with the front projection of an adjacent second electrode on the base.

According to some illustrative embodiments of the present application, there are multiple first electrodes and second electrodes, and front projections of the first electrodes on the base and the front projections of the second electrodes on the base are alternately arranged.

According to some illustrative embodiments of the present application, a number of the first electrodes and a number of the second electrodes are the same.

According to some illustrative embodiments of the present application, the front projection of at least one of the first electrodes on the base partially overlaps with the front projection of the adjacent second electrode on the base, and an overlapping width is less than or equal to 2 µm.

According to some illustrative embodiments of the present application, the intermediate layer comprises a passivation layer, the thickness of the passivation layer is greater than or equal to 50 nm and less than or equal to 250 nm.

According to some illustrative embodiments of the present application, the intermediate layer comprises a passivation layer, the second electrode comprises a metal layer arranged on the side, away from the base, of the passivation layer, and ITO covering the side, away from the base, of the metal layer, and the metal layer is made of at least one of Ag, AlNd and Al.

According to some illustrative embodiments of the present application, when the at least one first electrode is plural and the at least one second electrode is plural, front projections of via holes of at least two first electrodes or front projections of via holes of at least two second electrodes are located at one side of a front projection of an electrode of a secondary pixel.

According to some illustrative embodiments of the present application, the front projection of a via hole of the first electrode is located at a side of the front projection of electrodes of a secondary pixel, and the front projection of a via hole of the second electrode is located at an opposite side of the front projection of the electrodes of the secondary pixel.

According to some illustrative embodiments of the present application, when the at least one first electrode is plural and the at least one second electrode is plural, the first electrodes and the second electrodes are arranged in array, and at least two first electrodes or at least two second electrodes are staggered in a row direction or in a column direction.

According to some illustrative embodiments of the present application, the intermediate layer comprises a flat layer, the base comprises a substrate and a first thin film transistor and a second thin film transistor which are disposed on the side, near the flat layer, of the substrate, the first driving electrode is a source or drain of the first thin film transistor, and the second driving electrode is a source or drain of the second thin film transistor.

According to some illustrative embodiments of the present application, shapes of front projections of the first electrode and the second electrode on the base are at least one of quadrangle, pentagon, hexagon and octagon.

According to some illustrative embodiments of the present application, the front projections of the first electrode and the second electrode on the base are rectangular.

According to some illustrative embodiments of the present application, each first-color subpixel further comprises a luminescent layer and a cathode which are disposed on the side, away from the base, of the first electrode and the second electrode, the luminescent layer is discontinuous at a junction of the first electrode and the second electrode, and the first electrode and the second electrode are anodes.

According to some illustrative embodiments of the present application, the intermediate layer comprises a passivation layer and a flat layer, the base further comprises a third driving electrode;

a first passivation layer disposed on the side, away from the base, of the second electrode; and at least one third electrode disposed on the side, away from the base, of the first passivation layer, the third electrode being connected with the third driving electrode through via holes penetrating the first passivation layer, the passivation layer and the flat layer.

According to some illustrative embodiments of the present application, the base further comprises a fourth driving electrode;

a second passivation layer disposed on the side, away from the base, of the third electrode; and at least one fourth electrode disposed on the side, away from the base, of the second passivation layer, the fourth electrode being connected with the fourth driving electrode through via holes penetrating the second passivation layer, the first passivation layer, the passivation layer and the flat layer.

According to some illustrative embodiments of the present application, front projections of the at least one first electrode, the at least one second electrode, the at least one third electrode and the at least one fourth electrode on the base are distributed in an array along a first direction and a second direction, and the first direction and the second direction intersect.

According to some illustrative embodiments of the present application, the front projections of the at least one first electrode, the at least one second electrode, the at least one third electrode and the at least one fourth electrode on the base are alternately arranged in the first direction.

According to some illustrative embodiments of the present application, the combination of the front projections of the at least one first electrode, the at least one second electrode, the at least one third electrode and the at least one fourth electrode on the base is a continuously extending pattern.

According to some illustrative embodiments of the present application, the intermediate layer comprises a flat layer and a patterned passivation layer, the patterned passivation layer is disposed at a side of the flat layer that is away from the base, the first electrode is connected to the first driving electrode via a via hole penetrating the flat layer, the second electrode is connected to the second driving electrode via a via hole penetrating the patterned passivation layer and the flat layer.

In another aspect, there is provided a displaying device, comprising the display panel above, wherein light emitted from a part of secondary pixels enters a left eye of a viewer, and light emitted from another part of secondary pixels enters a right eye of the viewer.

In yet another aspect, there is provided a preparation method of a display panel, wherein the display panel comprises a plurality of first-color subpixels, the preparation method of the display panel comprises preparing each first-color subpixel, and preparing each first-color subpixel comprises:

providing a base, wherein the base comprises a first driving electrode and a second driving electrode;

forming a flat layer on the side, near the first driving electrode and the second driving electrode, of the base;

forming at least one first electrode on the side, away from the base, of the flat layer, wherein the first electrode is connected with the first driving electrode through via holes penetrating the flat layer; and sequentially forming a passivation layer and at least one second electrode on the side, away from the base, of the flat layer, wherein the second electrode is connected with the second driving electrode through via holes penetrating the passivation layer and the flat layer.

According to some illustrative embodiments, sequentially forming the passivation layer and at least one second electrode on the side, away from the base, of the flat layer comprises:

forming passivation material layers on the side, away from the base, of the flat layer and the side, away from the base, of the first electrode;

forming at least one second electrode on the side, away from the base, of the passivation material layer by a patterning process, wherein the front projection of the second electrode on the base is adjacent to or partially overlaps with the front projection of the adjacent first electrode on the base; and removing the passivation material layer on the side, away from the base, of the first electrode through dry etching by a self-alignment process to obtain the passivation layer.

According to some illustrative embodiments, the preparation method further comprises:

forming a luminescent layer on the side, away from the base, of the first electrode and the second electrode, wherein the luminescent layer is discontinuous at the junction of the first electrode and the second electrode; and forming a cathode on the side, away from the base, of the luminescent layer in a covering mode, wherein the first electrode and the second electrode are anodes.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to explain the technical solution in the embodiments of the disclosure more clearly, the drawings used in the description of the embodiments will be briefly introduced below. Obviously, the drawings in the following description are only some embodiments of the disclosure, and for those of ordinary skill in the art, other drawings can be obtained according to these drawings without paying creative labor.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
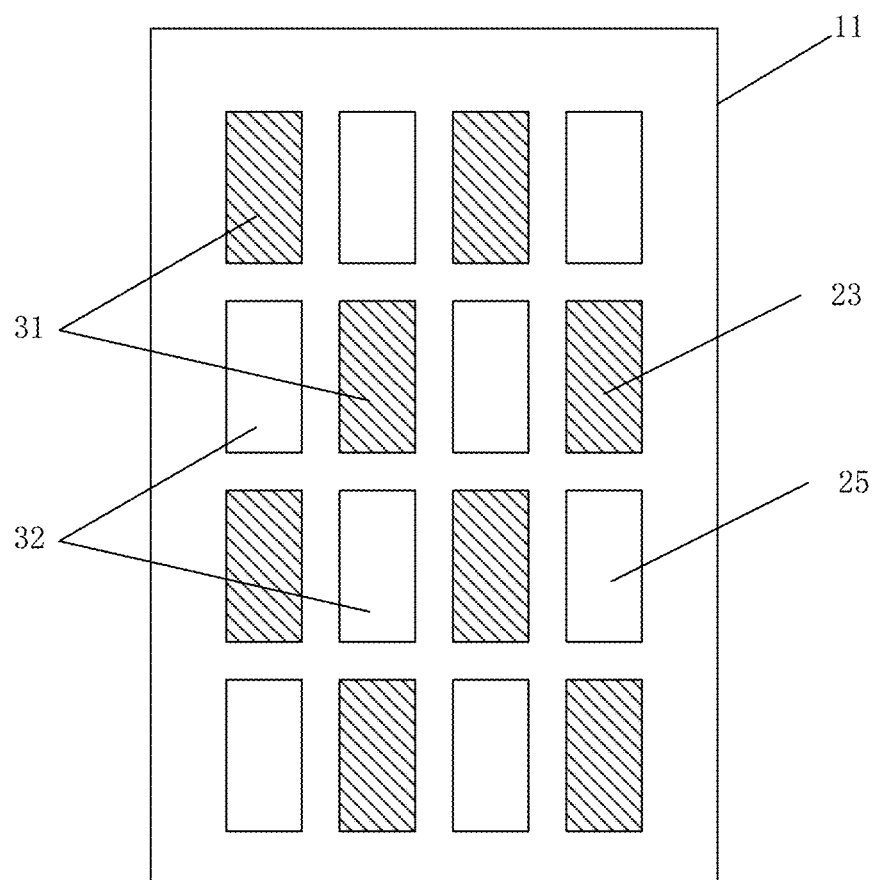
FIG. 1 shows a planar structural diagram of a first-color subpixel provided by some embodiments of the disclosure.
Figure 2:
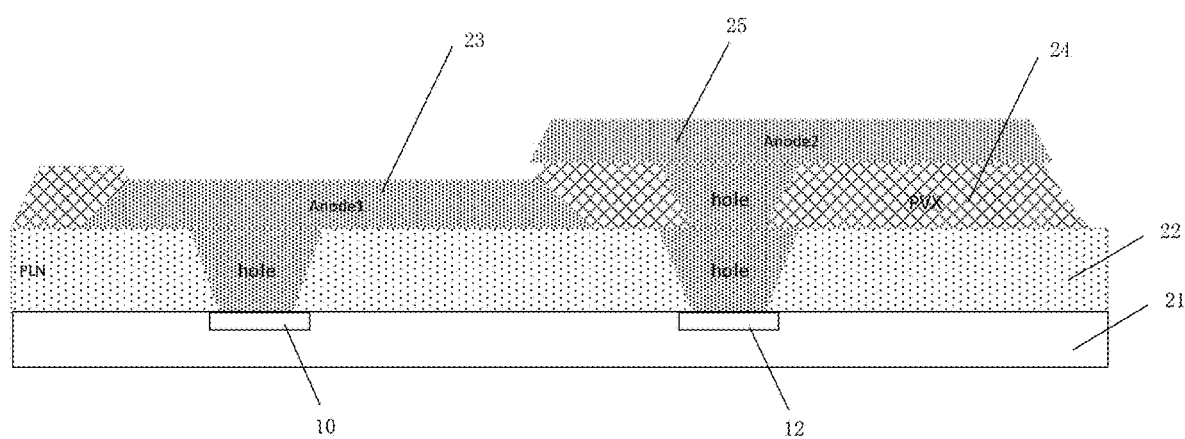
FIG. 2 shows a cross-sectional structural diagram of a display panel provided by some embodiments of the disclosure.

Some embodiments of the disclosure provide a display panel. Referring to FIGS. 1 and 2, the display panel may comprise a plurality of first-color subpixels 11, and each first-color subpixel 11 comprises a base 21, the base 21 comprising a first driving electrode 10 and a second driving electrode 12; a flat layer 22 disposed on the side, near the first driving electrode and the second driving electrode, of the base 21; a patterned passivation layer 24 and at least one first electrode 23 disposed on the side, away from the base 21, of the flat layer 22, the first electrode 23 being connected with the first driving electrode through via holes penetrating the flat layer 22; and at least one second electrode 25 disposed on the side, away from the base 21, of the passivation layer 24, the second electrode 25 being connected with the second driving electrode through via holes penetrating the passivation layer 24 and the flat layer 22.

The first-color subpixel 11 may be a red R/green G/blue B subpixel. The first electrode 23 and the second electrode 25 may be an anode or a cathode.

The base 21 may comprise a substrate and the first driving electrode and the second driving electrode which are disposed on one side of the substrate, and the flat layer 22 is disposed on the side, close to the first driving electrode and the second driving electrode, of the base 21.

The first driving electrode and the second driving electrode may be an active driving electrode, such as a source or drain of a thin film transistor, and can also be a passive driving electrode. Any driving electrode which can drive the first electrode 23 and the second electrode 25 separately is within the protection scope of this embodiment.

The first electrode 23 is located on the side, away from the base 21, of the flat layer 22, and is connected with the first driving electrode through the via holes formed in the flat layer 22. The passivation layer 24 covers the exposed areas of the first electrode 23 and the flat layer 22, and allows a surface of the first electrode 23 to be exposed at a corresponding position of the first electrode 23. The second electrode 25 is disposed on the side, away from the base 21, of the passivation layer 24, and is connected with the second driving electrode through the via holes formed in the flat layer 22 and the passivation layer 24. Referring to FIG. 1, the first electrodes 23 and the second electrodes 25 may be arranged in an array in the first-color subpixels 11. Referring to FIG. 2, the first electrodes 23 and the second electrodes 25 are stacked on different layers of the display panel.

The first electrode 23 and the second electrode 25 divide the first-color subpixel 11 into a plurality of secondary pixels 31/32, such as the secondary pixels 31 corresponding to the first electrode 23 and the secondary pixels 32 corresponding to the second electrode 25. Since the first electrode 23 and the second electrode 25 are insulated from each other and connected with different driving electrodes, the display of each secondary pixel can be independently controlled.

In the process of 3D display, by means of the grating type glasses-free 3D technology or cylindrical lens 3D display technology, light emitted by some secondary pixels can be controlled to enter the left eye and light emitted by some other secondary pixels enters the right eye; for example, light emitted by the secondary pixels corresponding to the first electrode 23 enters the left eye and light emitted by the secondary pixels corresponding to the second electrode 25 enters the right eye, so as to realize high-resolution 3D glasses-free display and overcome the defects of existing 3D display products such as low PPI, insufficient information and small 3D viewing angle.

According to the display panel provided in this embodiment, the first-color subpixel (R/G/B subpixel) is finely patterned into the plurality of secondary pixels, such as the secondary pixels corresponding to the first electrode 23 and the secondary pixels corresponding to the second electrode 25, and the electrodes of each secondary pixel are insulated from each other and connected with different driving electrodes respectively, so that the display of each secondary pixel can be driven independently. The display panel provided by the disclosure can realize high-resolution and high-definition glasses-free 3D display by using the grating type glasses-free 3D technology or cylindrical lens 3D display technology, can display more information and has a larger 3D viewing angle.

To further enhance the 3D glasses-free display effect, when there are multiple first electrodes 23 and/or second electrodes 25, the front projections of the first electrodes 23 on the base 21 and the front projections of the second electrodes 25 on the base 21 can be alternately arranged, as shown in FIG. 1.

Further, the number of the first electrodes 23 and the number of the second electrodes 25 can be set to be the same, so that the numbers of rows and columns of the secondary pixels included in the first-color subpixel 11 are both even, and it can be ensured that the number of the secondary pixels whose light enters the left eye is the same as that of the secondary pixels whose light enters the right eye. For example, the first-color subpixel 11 can be divided into 4*4 secondary pixels (the number of the first electrodes 23 and the number of the second electrodes 25 are both 8), 4*6 secondary pixels (the number of the first electrodes 23 and the number of the second electrodes 25 are both 12), or 6*6 secondary pixels (the number of the first electrodes 23 and the number of the second electrodes 25 are both 18). In practical application, the arrangement of the first electrodes 23 and the second electrodes 25 can be designed according to actual conditions, and is not limited to the above array arrangement.

Figure 3:
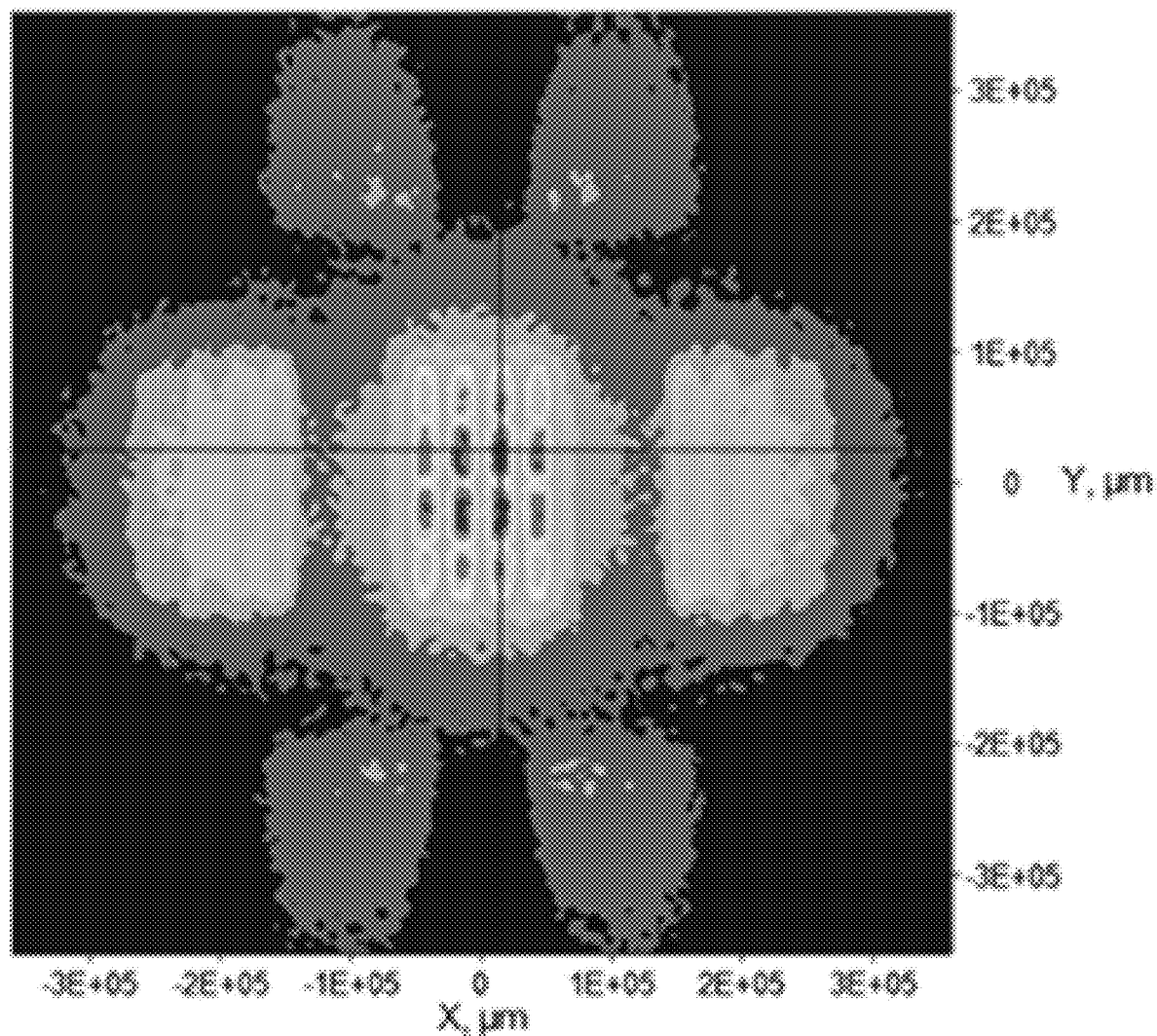
FIG. 3 shows a schematic diagram of the moire effect generated under the arrangement as shown in FIG. 1.

The inventor found that when the front projections, on the base 21, of a first electrode 23 and a second electrode 25 which are adjacent to each other are separated as shown in FIG. 1, the moire pattern tends to occur due to a gap between the electrodes, as shown in FIG. 3. In order to avoid the moire pattern, the gap between the electrodes needs to be reduced. In one implementation mode, the front projection of the first electrode 23 on the base 21 is adjacent to or partially overlaps with the front projection of the adjacent second electrode 25 on the base 21, that is, the front projections, on the base 21, of the first electrode 23 and the second electrode 25 which are adjacent to each other adjoin each other or partially overlap.

It should be noted that the expression "the front projection of the first electrode on the base is adjacent to the front projection of the adjacent second electrode on the base" herein means that the front projection of the first electrode on the substrate and the front projection of the adjacent second electrode on the base have only one coincident line, for example, the front projection of the first electrode on the base is close to a first side of the front projection of the second electrode, the front projection of the second electrode on the base has a second side close to the front projection of the first electrode, and the first side and the second side coincide with each other.

Meanwhile, in order to avoid coupling capacitance or display crosstalk at the overlapping part of the first electrode 23 and the second electrode 25, when the front projection of the first electrode 23 on the base 21 partially overlaps with the front projection of the second electrode 25 on the base 21, the overlapping width may be less than or equal to 2 μm.

In this implementation mode, although the front projections of the adjacent first electrode 23 and second electrode 25 on the base 21 are close to or overlap with each other, short circuiting between the first electrode 23 and the second electrode 25 can be avoided due to the passivation layer 24 arranged therebetween. The thickness of the passivation layer 24 may be greater than or equal to 50 nm and less than or equal to 250 nm, and the material of the passivation layer may be, for example, insulating materials such as SiNx and SiOx.

The material of the first electrode 23 and the second electrode 25 may be electrode material such as ITO and metal. The thickness of ITO on both sides can be 8 nm, the thickness of an intermediate metal layer (such as Ag or AlNd) can be 100 nm, and the specific thickness can be set according to the actual situation.

In the implementation process, the inventor found that the etching rate of ITO is different from that of the intermediate metal layer, and ITO, near the passivation layer 24, of the second electrode 25 tends to overlap with the first electrode 23 to cause short circuiting. Therefore, in order to avoid short circuiting, the second electrode 25 may comprise a metal layer arranged on the side, away from the base 21, of the passivation layer 24, and ITO covering the side, away from the base 21, of the metal layer, and the metal layer may be made of at least one of Ag, AlNd and Al. Experiments show that the second electrode 25 is not provided with ITO in contact with the passivation layer 24, which can effectively avoid the short circuiting problem.

Figure 7A:
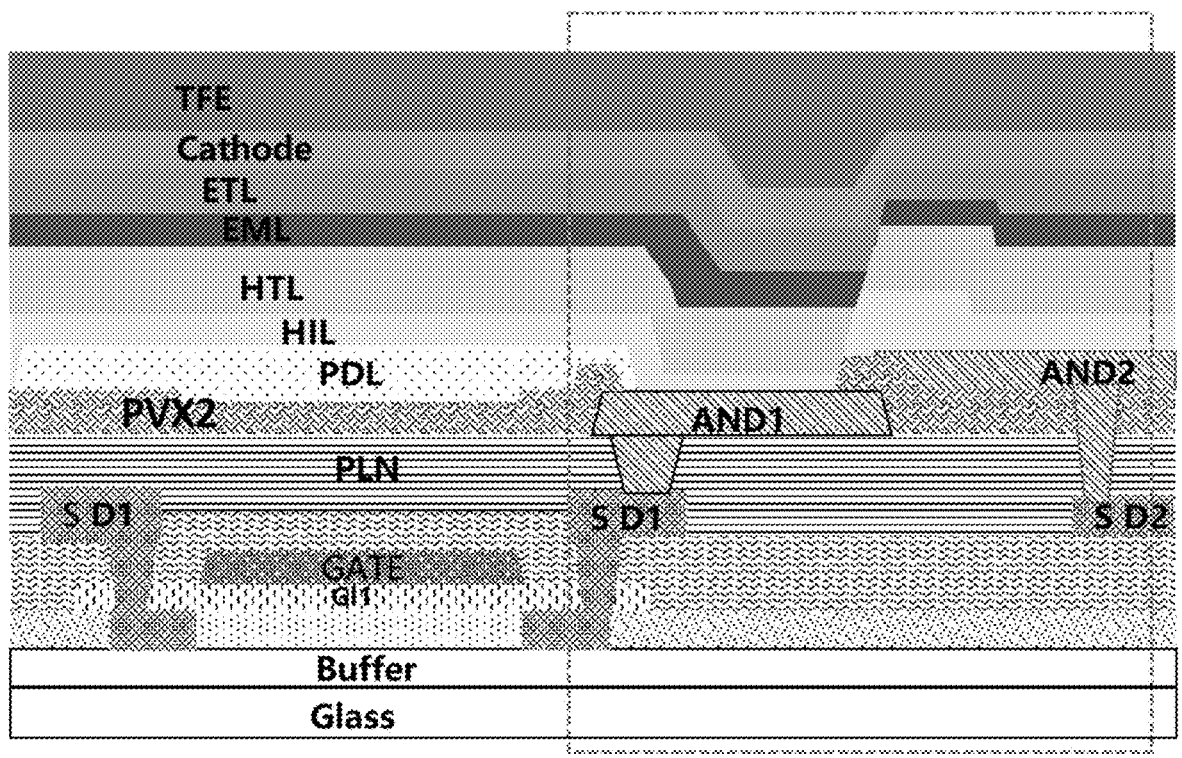
FIG. 7A shows a cross-sectional structural diagram of a specific implementation mode of a display panel provided by some embodiments of the disclosure.
Figure 7B:
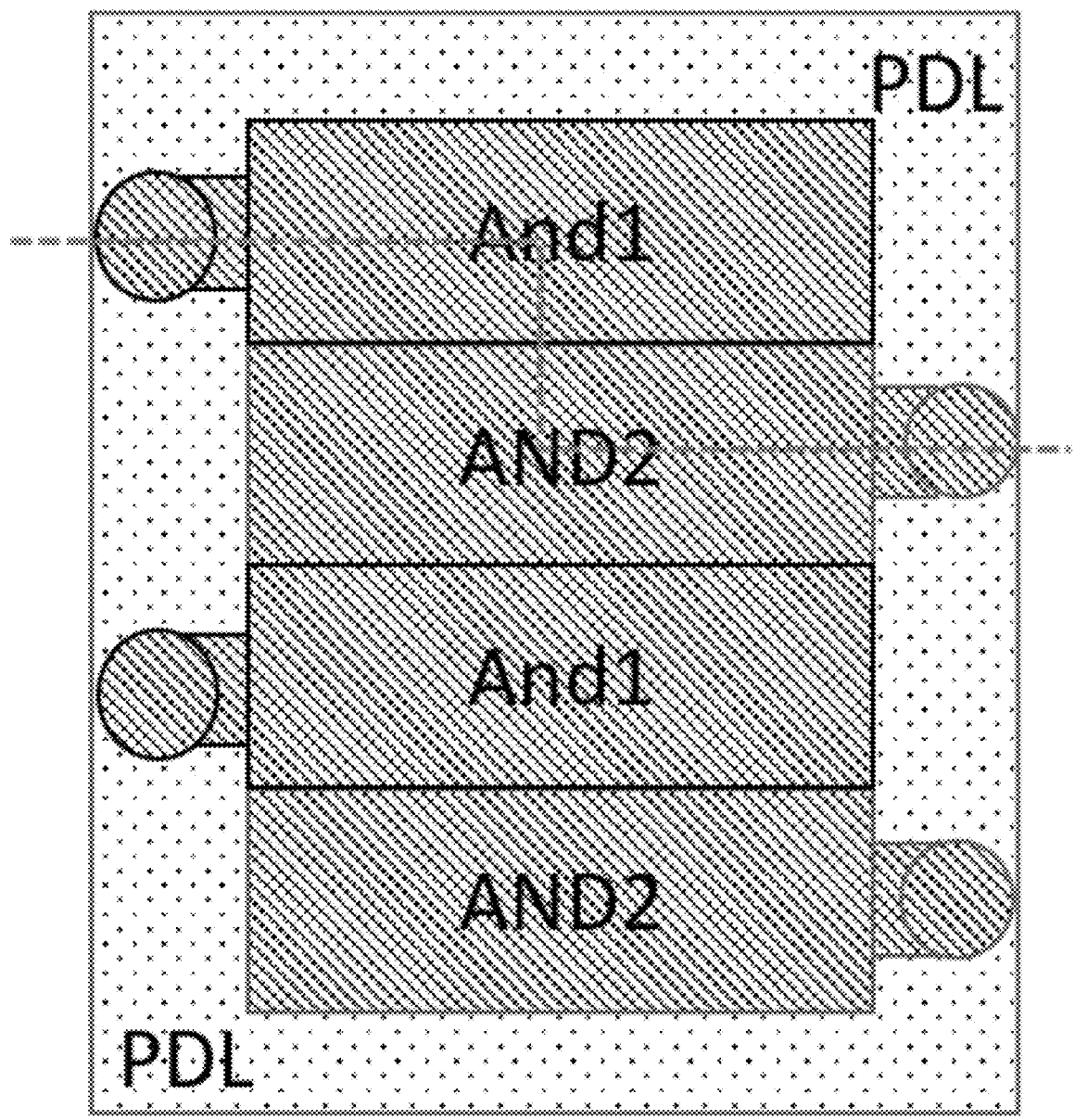
FIG. 7B shows a planar structural diagram of a specific implementation mode of a display panel provided by some embodiments of the disclosure.

In an implementation mode, as shown in FIGS. 7A and 7B, the base 21 comprises a substrate and a first thin film transistor and a second thin film transistor which are disposed on the side, near the flat layer 22, of the substrate, the first driving electrode is a source or drain (SD1) of the first thin film transistor, and the second driving electrode is a source or drain (SD2) of the second thin film transistor. In the implementation mode, the first driving electrode and the second driving electrode are active driving electrodes.

For example, in the embodiment shown in FIGS. 7A and 7B, the base 21 comprises a substrate (shown as Glass in FIG. 7A), a buffer layer (shown as Buffer in FIG. 7A) disposed on the substrate, and a plurality of thin film transistors disposed on the side, away from the substrate, of the buffer layer. The display panel comprises a flat layer (shown as PLN in FIG. 7A) disposed on the side, away from the substrate, of the thin film transistors, a first electrode 23 (shown as AND1 in FIG. 7A) disposed on the side, away from the substrate, of the flat layer, a passivation layer (shown as PVX2 in FIG. 7A) disposed on the side, away from the substrate, of the first electrode 23, and a second electrode 25 (shown as AND2 in FIG. 7A) disposed on the side, away from the substrate, of the passivation layer. The thin film transistor comprises an active layer, a gate insulating layer (shown as GI1 in FIG. 7A), a gate (shown as GATE in FIG. 7A), and a source and a drain (shown as SD1 and SD2 in FIG. 7A). The display panel also comprises a pixel defining layer (shown as PDL in FIG. 7B). The pixel defining layer defines a plurality of openings in which electrodes such as the first electrode 23 and the second electrode 25 are located. The display panel may also comprise a luminescent layer and a cathode (shown as Cathode in FIG. 7A). The luminescent layer may comprise a hole injection layer (shown as HIL in FIG. 7A), a hole transporting layer (shown as HTL in FIG. 7A), a luminescent material layer (shown as EML in FIG. 7A), an electron transporting layer (shown as ETL in FIG. 7A), and the like. The display panel may further comprise a packaging layer (shown as TFE in FIG. 7A) for packaging the display panel.

Figure 4:
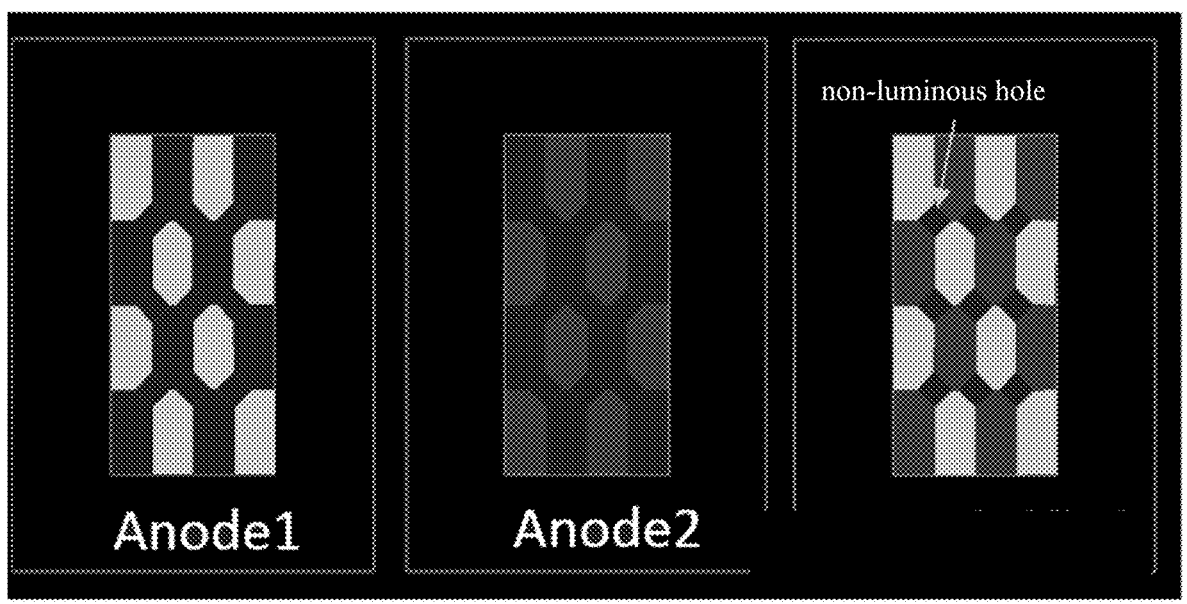
FIG. 4 shows a planar structural diagram of a double-layer electrode structure provided by some embodiments of the disclosure.

In one implementation mode, the shapes of the front projections of the first electrode 23 and the second electrode 25 on the base 21 are at least one of quadrangle, pentagon, hexagon and octagon, or the shape like quadrangle, pentagon, hexagon or octagon. With reference to FIG. 4, a planar structural diagram of a double-layer electrode structure is shown. Through the double-layer electrode structural design (the first electrode 23 is anode1 and the second electrode 25 is anode2), electrode spacing can be reduced. For example, the front projections of adjacent electrodes on the base 21 are set to adjoin each other or partially overlap, thereby increasing the luminous area of the secondary pixels, prolonging the life of EL devices indirectly and avoiding the generation of the moire pattern. Since the electrode in FIG. 4 is hexagonal, there is still a dark area (as shown by "non-luminous hole" in FIG. 4) after the double-layer electrodes are spliced.

Further, the front projections of the first electrode 23 and the second electrode 25 on the base 21 may be rectangular or the shape like rectangular.

Figure 5A:
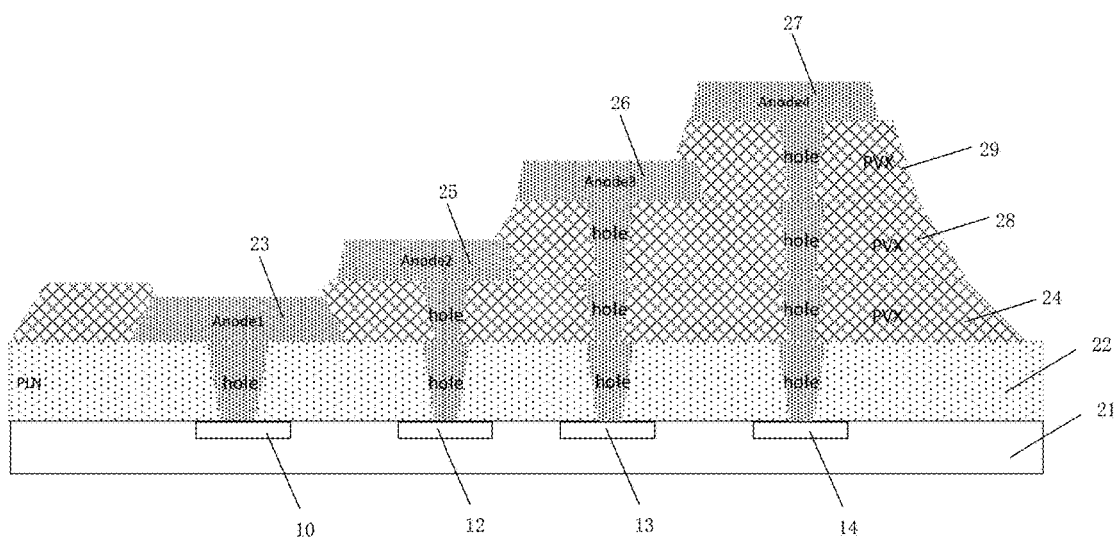
FIG. 5A shows a cross-sectional view of a four-layer electrode structure.
Figure 5B:
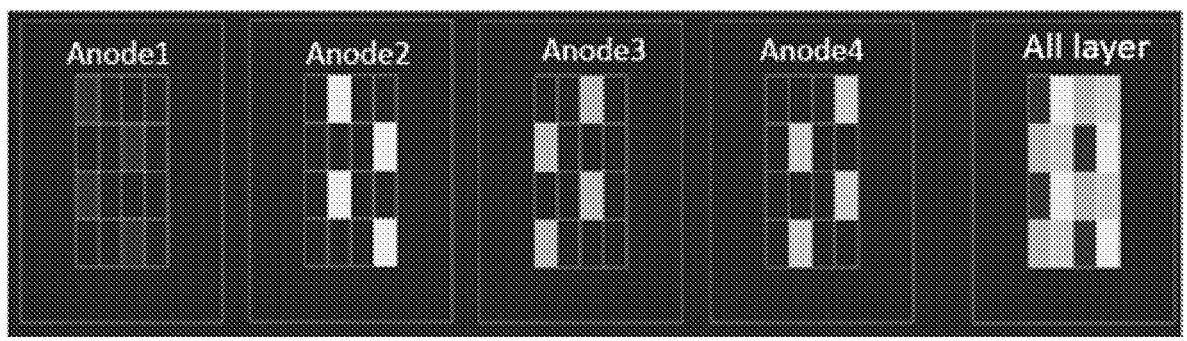
FIG. 5B shows a planar structural diagram of a four-layer electrode structure provided by some embodiments of the disclosure.
Figure 6:
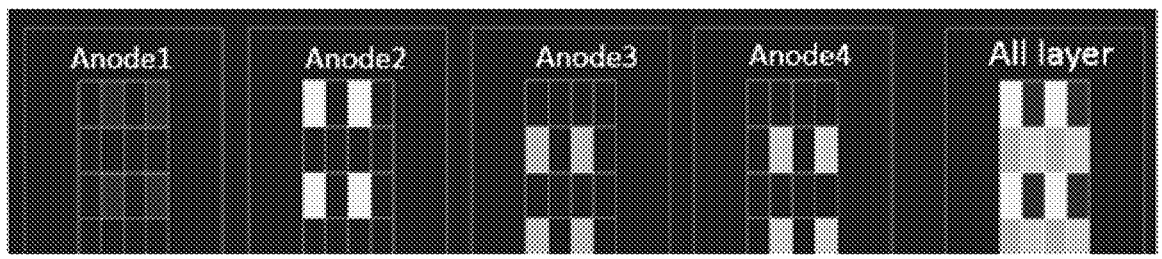
FIG. 6 shows a planar structural diagram of another four-layer electrode structure provided by some embodiments of the disclosure.

FIG. 5A shows a cross-sectional view of a four-layer electrode structure, and FIG. 5B and FIG. 6 show a planar structural diagram of a four-layer electrode structure respectively. A passivation layer is arranged between every two adjacent layers of electrodes (anode1 and anode2, anode2 and anode3, and anode3 and anode4). Since the electrodes are rectangular, by reducing electrode spacing, for example, setting the front projections of adjacent anodes on the base 21 to adjoin each other or partially overlap, the seamless design of the secondary pixels can be realized, and continuous light emission between the secondary pixels in the sub-pixels can be realized.

Referring to FIGS. 5A, 5B and 6, the base may further comprise a third driving electrode 13 and a fourth driving electrode 14. The subpixel may further comprise a first passivation layer 28 disposed on the side, away from the base, of the second electrode 25, at least one third electrode 26 disposed on the side, away from the base, of the first passivation layer 28, a second passivation layer 29 disposed on the side, away from the base, of the third electrode 26, and at least one fourth electrode 27 disposed on the side, away from the base, of the second passivation layer 29. The third electrode 26 is connected with the third driving electrode 13 through via holes penetrating the first passivation layer, the passivation layer and the flat layer. The fourth electrode 27 is connected with the fourth driving electrode 14 through via holes penetrating the second passivation layer, the first passivation layer, the passivation layer and the flat layer.

As shown in FIGS. 5B and 6, the front projections of the at least one first electrode 23, the at least one second electrode 25, the at least one third electrode 26 and the at least one fourth electrode 27 on the base are distributed in an array along a first direction and a second direction (for example, the horizontal direction and the vertical direction shown in FIGS. 5B and 6), and the first direction and the second direction intersect.

The front projections of the at least one first electrode 23, the at least one second electrode 25, the at least one third electrode 26 and the at least one fourth electrode 27 on the base are alternately arranged in the first direction.

The combination of the front projections of the at least one first electrode 23, the at least one second electrode 25, the at least one third electrode 26 and the at least one fourth electrode 27 on the base is a continuously extending pattern.

It should be noted that the "continuously extending pattern" here means that the pattern is complete with no gap or blank.

By stacking the first electrode 23 and the second electrode 25, the gap between the electrode layers of the secondary pixels can be reduced, the luminous area of the secondary pixels in the subpixels can be increased, and the serious moire effect caused by the large space between the electrodes can be avoided. When the first electrode 23 and the second electrode 25 are rectangular, continuous light emission in the subpixels can be realized.

In an implementation mode, each first-color subpixel may further comprise a luminescent layer, a cathode and a packaging layer disposed on the side, away from the base 21, of the first electrode 23 and the second electrode 25. In order to avoid display crosstalk, the luminescent layer is discontinuous at the junction of the first electrode 23 and the second electrode 25, and the first electrode 23 and the second electrode 25 are anodes. The cathode is continuous at the junction of the first electrode 23 and the second electrode 25.

In the implementation mode, the display panel is an OLED display panel, which may be of a top emission structure or a bottom emission structure. When the OLED display panel is of a top emission structure, the first electrode 23 and the second electrode 25 (anode) can be reused as reflective layers, and can be made of ITO/Ag/ITO, ITO/Mo/ITO, Mo/AL/Mo, Mo/ALNb/Mo, ITO/AL/ITO, Mo/Ag/ITO, etc.

The anodes in the R/G/B subpixels are patterned in the top-emitting OLED display panel, and the corresponding secondary pixels are driven independently by a plurality of anodes (the first electrode 23 and the second electrode 25), so that the number of the secondary pixels in the subpixel is maximized, for example, 4×4 secondary pixel division can be realized on the basis of retina resolution (326PPI), thereby improving the 3D display resolution and image quality of the OLED. By making the front projections of adjacent anodes on the base 21 adjoin each other or partially overlap, the luminous area of the secondary pixels is increased, the service life of EL devices is prolonged indirectly, and the generation of the moire pattern is avoided.

In actual application, the base 21 may also comprise a GOA (gate driver on array), an EOA (EM GOA), a driving circuit, a compensation circuit and other structures disposed on the substrate.

According to the technical solution disclosed by the disclosure, the subpixel electrodes are finely patterned again, and the structural design of the laminated electrodes (the first electrode 23 and the second electrode 25) can further increase the luminous area of the secondary pixels corresponding to the first electrode 23 and the second electrode 25, reduce the proportion of non-luminous areas of the subpixels, reduce the gap between the secondary pixel electrodes, enable the secondary pixels to emit light continuously, and minimize the influence of the moire pattern, thus solving the problems of low visual resolution and discontinuous view of the glasses-free 3D technology at present, and making the 3D view larger and more life-like.

Other embodiments of the disclosure also provide a displaying device, which comprises the display panel according to any of the embodiments.

It should be noted that the displaying device in this embodiment can be any product or component with a 2D or 3D display function, such as display panel, electronic paper, mobile phone, tablet computer, TV set, notebook computer, digital photo frame and navigator.

For products with the 3D display function, the glasses-free 3D technology can be divided into the grating type glasses-free 3D technology and the cylindrical lens 3D display technology according to different display principles. The displaying device based on the grating type glasses-free 3D technology has attracted the attention of the display industry because of its simple manufacturing process, low-level crosstalk and low production cost. This displaying device uses a parallax barrier similar to the grating effect between a backlight module and a display panel to generate alternately bright and dark stripes, the light of each bright stripe passes through the display panel to form a view into the left eye of the viewer and a view into the right eye of the viewer, and because each bright stripe emits light from two angles to form the left view and the right view which are two images with parallax, the viewer can see a 3D image without wearing 3D glasses after the left view and the right view with parallax are superimposed and regenerated in the viewer's brain.

Figure 8:
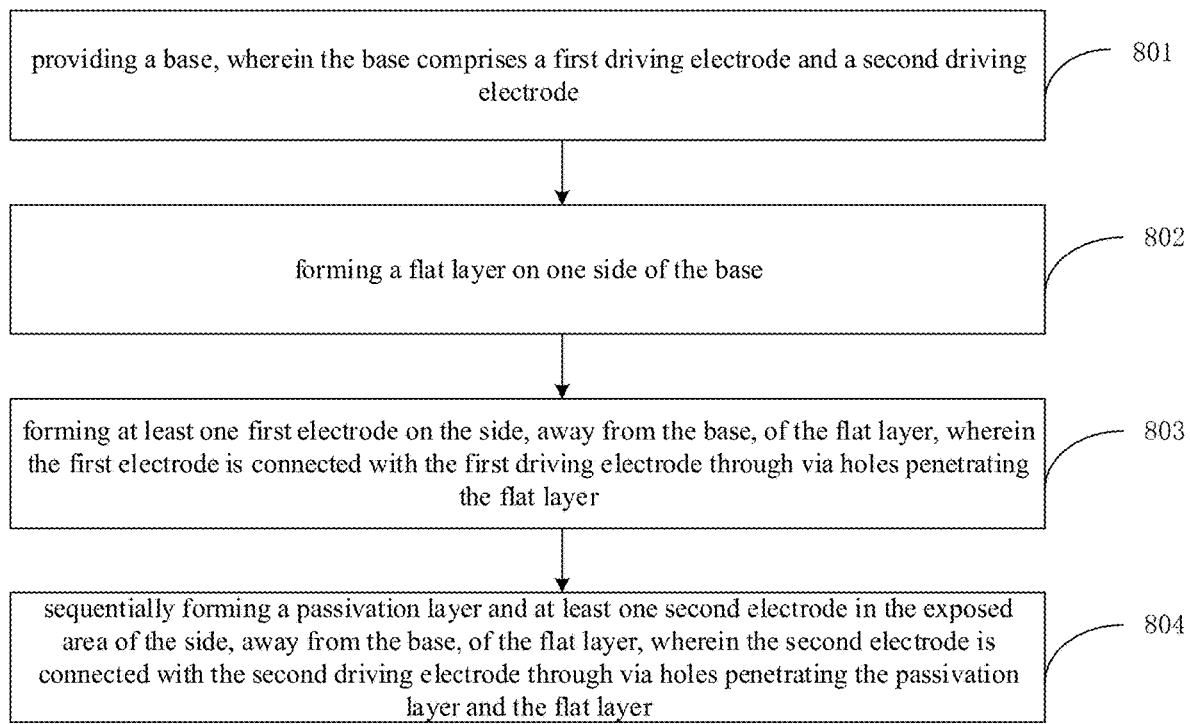
FIG. 8 shows a flowchart of a preparation method of a display panel provided by some embodiments of the disclosure.

Other embodiments of the disclosure also provide a preparation method of a display panel, wherein the display panel comprises a plurality of first-color subpixels. Referring to FIG. 8, a preparation method of each first-color subpixel may comprise:

Step 801, providing a base, wherein the base comprises a first driving electrode and a second driving electrode.

The base may comprise a substrate and the first driving electrode and the second driving electrode formed on one side of the substrate.

Step 802, forming a flat layer on the side, near the first driving electrode and the second driving electrode, of the base.

Step 803, forming at least one first electrode on the side, away from the base, of the flat layer, wherein the first electrode is connected with the first driving electrode through via holes penetrating the flat layer.

Specifically, a patterning process can be adopted to form the first electrode on the flat layer. For example, a first electrode material layer is sputtered on the flat layer, and then patterned by a series of processes such as exposure and development to obtain one or more first electrodes.

Step 804, sequentially forming a passivation layer and at least one second electrode on the side, away from the base, of the flat layer, wherein the second electrode is connected with the second driving electrode through via holes penetrating the passivation layer and the flat layer.

The via holes formed in the passivation layer and the flat layer for connecting the second electrode with the second driving electrode can be formed twice. For example, the via holes in the flat layer can be formed before preparing the passivation layer, and the via holes penetrating the passivation layer and the flat layer can be formed after the passivation layer is prepared. The via holes penetrating the passivation layer and the flat layer can also be formed at one time after the passivation layer is prepared.

The preparation method provided in the embodiment can be used to prepare the display panel described in any of the above embodiments.

Figure 9:
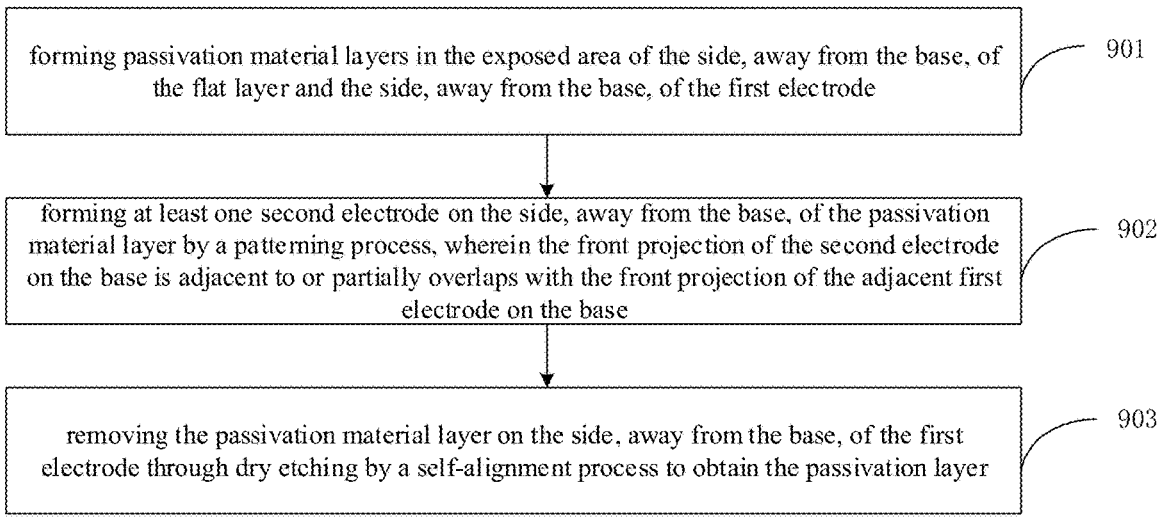
FIG. 9 shows a flowchart for preparing a passivation layer and a second electrode provided by some embodiments of the disclosure.

In an implementation mode, referring to FIG. 9, Step 804 may specifically comprise:

Step 901, forming passivation material layers on the side, away from the base, of the flat layer and the side, away from the base, of the first electrode.

Step 902, forming at least one second electrode on the side, away from the base, of the passivation material layer by a patterning process, wherein the front projection of the second electrode on the base is adjacent to or partially overlaps with the front projection of the adjacent first electrode on the base.

Step 903, removing the passivation material layer on the side, away from the base, of the first electrode through dry etching by a self-alignment process to obtain the passivation layer.

Figure 11:
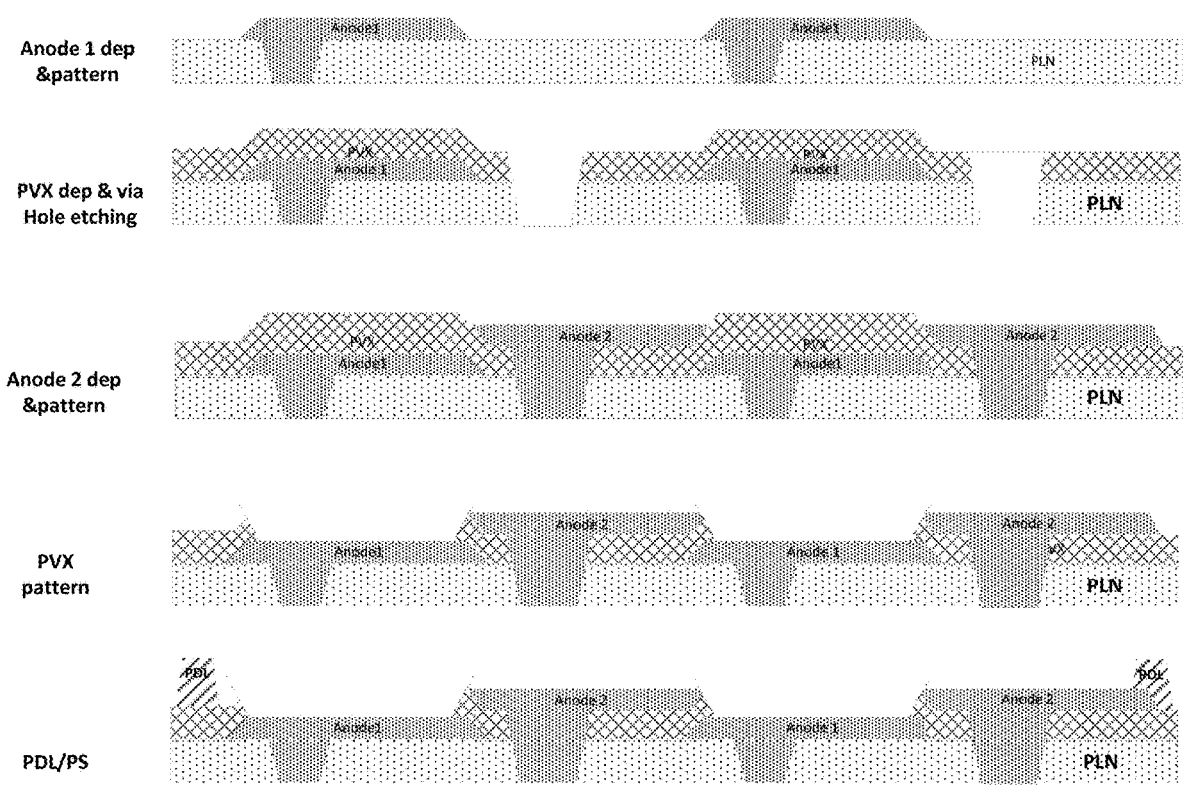
FIG. 11 shows a cross-sectional structural diagram of each process stage of a preparation method of a display panel provided by some embodiments of the disclosure.

A first electrode layer Anode1 and s second electrode layer Anode2 are formed by the patterning process, and a PVX passivation layer is added therein. After the second electrode layer is formed, the PVX on the Anode1 is removed through dry etching by means of the self-alignment process of the second electrode layer Anode2, so that the first electrode layer is exposed, which minimizes the gap between the laminated electrodes due to the limitation of the Photo OL level and achieves seamless splicing of the two layers of secondary pixel electrodes. Referring to FIG. 11, a schematic diagram of each process stage of a preparation method of a display panel is shown.

It should be noted that, considering factors such as actual process errors, in order to make the gap between the prepared first electrode layer and the second electrode layer zero, an overlap between the first electrode layer and the second electrode layer can be set at the design stage, for example, the overlap is greater than 0.8 μm.

Figure 10:
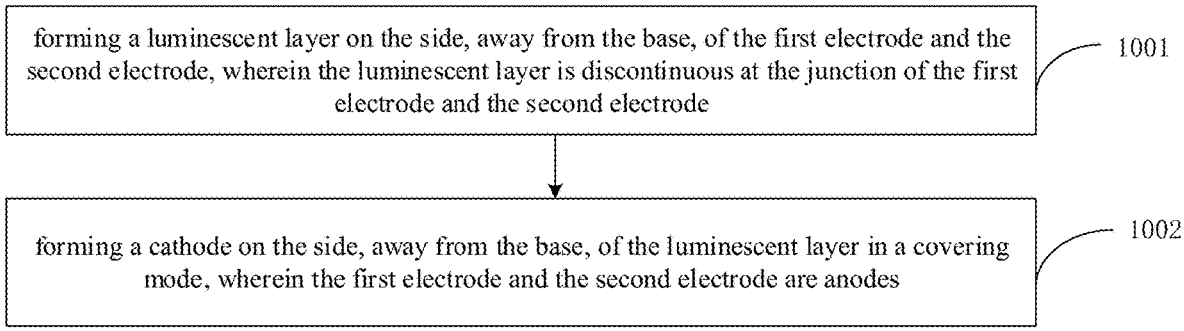
FIG. 10 shows a flowchart for preparing a luminescent layer and a cathode provided by some embodiments of the disclosure.

In specific implementation, referring to FIG. 10, the preparation method provided in the embodiment may further comprise:

Step 1001, forming a luminescent layer on the side, away from the base, of the first electrode and the second electrode, wherein the luminescent layer is discontinuous at the junction of the first electrode and the second electrode.

Step 1002, forming a cathode on the side, away from the base, of the luminescent layer in a covering mode, wherein the first electrode and the second electrode are anodes.

The cathode is continuous at the junction of the first electrode and the second electrode.

The embodiments provide a preparation method of a display panel, a display panel and a displaying device. The first-color subpixel (R/G/B subpixel) is patterned again into the plurality of secondary pixels, such as the secondary pixels corresponding to the first electrode and the secondary pixels corresponding to the second electrode, and the electrodes of each secondary pixel are connected with different driving electrodes respectively, so that the display of each secondary pixel can be driven independently. The display panel provided by the disclosure can realize high-resolution and high-definition glasses-free 3D display by using the grating type glasses-free 3D technology or cylindrical lens 3D display technology. Further, through the seamless splicing of the adjacent first electrode and second electrode, the secondary pixels in the sub-pixels can emit light continuously, and the generation of the moire pattern is avoided.

All the embodiments in this specification are described in a progressive way, and each embodiment focuses on the differences from other embodiments. The same and similar parts among the embodiments are referable to one another.

Finally, it should be noted that relational terms such as first and second are only used herein to distinguish one entity or operation from another entity or operation, and do not necessarily require or imply any such actual relationship or order between these entities or operations. Further, the terms "comprise", "include" or any other variant thereof are intended to cover non-exclusive inclusion, so that a process, method, commodity or device including a series of elements includes not only those elements, but also other elements not explicitly listed, or elements inherent to such process, method, commodity or device. Without further restrictions, the elements defined by the sentence "comprise one . . . " do not exclude the existence of other identical elements in the process, method, commodity or device comprising the elements.

The preparation method of the display panel, the display panel, and the displaying device provided by the disclosure are described in detail above. Specific examples are applied herein to illustrate the principle and implementation of the disclosure. The above embodiments are only used to help understand the method of the disclosure and its core ideas. For those of ordinary skill in the art, according to the idea of this disclosure, there will be some changes in the specific implementation and application scope. To sum up, the contents of this specification should not be understood as a limitation of this disclosure.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

Finally, it should be noted that the above embodiments are merely intended to explain the technical solutions of the present disclosure, and not to limit them. Although the present disclosure is explained in detail by referring to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. A display panel, comprising a plurality of first-color subpixels, wherein each first-color subpixel comprises:
 a base, the base comprising a first driving electrode and a second driving electrode;
 at least one first electrode, disposed at a side of the base and is connected to the first driving electrode;
 at least one second electrode, disposed at a same side of the base with the first electrode and is connected to the second driving electrode;
 an intermediate layer, disposed between the first electrode and the second electrode;
 wherein the first electrode and the second electrode divide the first-color subpixel into a plurality of secondary pixels, the first electrode and the second electrode are insulated with each other via the intermediate layer, and are respectively connected to the first driving electrode and the second driving electrode, and control the secondary pixels independently;
 wherein a front projection of the at least one first electrode on the base is adjacent to or partially overlaps with a front projection of an adjacent second electrode on the base;
 wherein a front projection of a via hole of the first electrode on the base is located at a side of the front projection of electrodes of a secondary pixel on the base, and a front projection of a via hole of the second electrode on the base is located at an opposite side of the front projection of the electrodes of the secondary pixel on the base.

2. The display panel according to claim 1, wherein there are multiple first electrodes and second electrodes, and front projections of the first electrodes on the base and front projections of the second electrodes on the base are alternately arranged.

3. The display panel according to claim 2, wherein a number of the first electrodes and a number of the second electrodes are the same.

4. The display panel according to claim 1, wherein the front projection of the at least one first electrode on the base partially overlaps with the front projection of the adjacent second electrode on the base, and an overlapping width is less than or equal to 2 μm.

5. The display panel according to claim 1, wherein the intermediate layer comprises a passivation layer, a thickness of the passivation layer is greater than or equal to 50 nm and less than or equal to 250 nm.

6. The display panel according to claim 1, wherein the intermediate layer comprises a passivation layer, the second electrode comprises a metal layer arranged on the side, away from the base, of the passivation layer, and ITO covering the side, away from the base, of the metal layer, and the metal layer is made of at least one of Ag, AlNd and Al.

7. The display panel according to claim 2, wherein when the at least one first electrode is plural and the at least one second electrode is plural, front projections of via holes of at least two first electrodes on the base or front projections of via holes of at least two second electrodes on the base are located at one side of the front projection of the electrodes of the secondary pixel on the base.

8. The display panel according to claim 2, wherein when the at least one first electrode is plural and the at least one second electrode is plural, the first electrodes and the second electrodes are arranged in array, and at least two first electrodes or at least two second electrodes are staggered in a row direction or in a column direction.

9. The display panel according to claim 1, wherein the intermediate layer comprises a flat layer, the base comprises a substrate and a first thin film transistor and a second thin film transistor which are disposed on the side, near the flat layer, of the substrate, the first driving electrode is a source or drain of the first thin film transistor, and the second driving electrode is a source or drain of the second thin film transistor.

10. The display panel according to claim 1, wherein shapes of front projections of the first electrode and the second electrode on the base are at least one of quadrangle, pentagon, hexagon and octagon.

11. The display panel according to claim 10, wherein the front projections of the first electrode and the second electrode on the base are rectangular.

12. The display panel according to claim 1, wherein each first-color subpixel further comprises a luminescent layer and a cathode which are disposed on the side, away from the base, of the first electrode and the second electrode, the luminescent layer is discontinuous at a junction of the first electrode and the second electrode, and the first electrode and the second electrode are anodes.

13. The display panel according to claim 1, wherein the intermediate layer comprises a passivation layer and a flat layer, the base further comprises a third driving electrode;
 a first passivation layer disposed on the side, away from the base, of the second electrode; and
 at least one third electrode disposed on the side, away from the base, of the first passivation layer, the third electrode being connected with the third driving electrode through via holes penetrating the first passivation layer, the passivation layer and the flat layer.

14. The display panel according to claim 13, wherein the base further comprises a fourth driving electrode;
 a second passivation layer disposed on the side, away from the base, of the third electrode; and
 at least one fourth electrode disposed on the side, away from the base, of the second passivation layer, the fourth electrode being connected with the fourth driving electrode through via holes penetrating the second passivation layer, the first passivation layer, the passivation layer and the flat layer.

15. The display panel according to claim 14, wherein front projections of the at least one first electrode, the at least one second electrode, the at least one third electrode and the at least one fourth electrode on the base are distributed in an array along a first direction and a second direction, and the first direction and the second direction intersect.

16. The display panel according to claim 15, wherein the front projections of the at least one first electrode, the at least one second electrode, the at least one third electrode and the at least one fourth electrode on the base are alternately arranged in the first direction.

17. The display panel according to claim 15, wherein the combination of the front projections of the at least one first electrode, the at least one second electrode, the at least one third electrode and the at least one fourth electrode on the base is a continuously extending pattern.

18. The display panel according to claim 1, wherein the intermediate layer comprises a flat layer and a patterned passivation layer, the patterned passivation layer is disposed at a side of the flat layer that is away from the base, the first electrode is connected to the first driving electrode via a via hole penetrating the flat layer, the second electrode is connected to the second driving electrode via a via hole penetrating the patterned passivation layer and the flat layer.

19. A displaying device, comprising the display panel according to claim 1, wherein light emitted from a part of secondary pixels enters a left eye of a viewer, and light emitted from another part of secondary pixels enters a right eye of the viewer.

* * * * *